United States Patent [19]

Watanabe

[11] Patent Number: 4,807,197
[45] Date of Patent: Feb. 21, 1989

[54] INTEGRATED CIRCUIT WITH FUNCTION OF MONITORING AN INTERNAL SIGNAL
[75] Inventor: Hiroshi Watanabe, Tokyo, Japan
[73] Assignee: NEC Corporation, Tokyo, Japan
[21] Appl. No.: 774,430
[22] Filed: Sep. 10, 1985
[30] Foreign Application Priority Data
Sep. 10, 1984 [JP] Japan .................... 59-189107
[51] Int. Cl.⁴ .................... G11C 7/00
[52] U.S. Cl. .................... 365/222; 365/189
[58] Field of Search .................... 365/189, 222, 230
[56] References Cited
U.S. PATENT DOCUMENTS
4,334,295 6/1982 Nagami .................... 365/222
4,480,321 10/1984 Aoyama .................... 365/230

Primary Examiner—James W. Moffitt
Attorney, Agent, or Firm—Sughrue, Mion, Zinn, Macpeak & Seas

[57] ABSTRACT

An improved semiconductor integrated circuit having a circuit for monitoring an internal signal which is not taken out from a chip is disclosed. The monitoring circuit includes a transistor having a control electrode to which the internal signal is applied, and a voltage switching element connected in series with the transistor between two external terminals. The voltage switching element is rendered conductive when a voltage of a predetermined value or more is impressed between the two external terminals.

10 Claims, 3 Drawing Sheets

4,807,197

INTEGRATED CIRCUIT WITH FUNCTION OF MONITORING AN INTERNAL SIGNAL

BACKGROUND OF THE INVENTION

The present invention relates to integrated circuits and more particularly to integrated circuit memory devices having an automatic refreshing function.

Integrated circuits have been widely used in various fields, and there are many types of integrated circuits.

In order to check functions of integrated circuits, it has been practiced that relationships between inputs - outputs are observed. This technique is effective for integrated circuits having combination logic circuits such as AND, NOR gates since an input to the integrated circuit and its relevant output therefrom can be obtained through a small lapse of time or almost at the same time. However, for integrated circuits having sequential logic circuits such as shift registers, and memory circuits, an output is obtained after a predetermined time has elapsed from the application of an input. Therefore, it has been difficult to check the function of such integrated circuits by observing input-output characteristics. This problem is very typical in an integrated circuit memory (IC memory) having an automatic or internal refreshing function in which a refresh operation for memory cells is internally performed repeatedly without receiving any refresh address information and refresh timing signals. The above type IC memory has a refresh timer circuit and an auto-refresh timing signal generator. When a refresh control signal applied to the refresh timer circuit from the outside is kept at an active level, the refresh timer circuit produces an internal refresh command signal intermittently and the auto-refresh timing signal generator produces a refresh timing signal for allowing an internal refresh operation in response to the internal command signal. In this memory, as long as the refresh control signal is kept active, refresh of memory cells is sequentially conducted without necessity of control from the outside. Heretofore, a long period of time has been required to evaluate a data-holding function of memory cells in such memory because a holding time of memory cells is generally 10 seconds or more and generally two to three times the holding time is employed in evaluation for the sake of safety. In this point of view, if it is possible to observe the internal signal for controlling the refresh operation directly, evaluation of memories would be conducted effectively. However, the number of pins of such memories has been limited to a certain number, e.g. 16, according to the commercial specification or standard, and therefore there has been no allowance to provide an additional pin for observing the internal signal.

SUMMARY OF THE INVENTION

It is one object of the present invention to provide an improved integrated circuit with the function of monitoring an internal signal.

It is another object of the present invention to provide a semiconductor memory device of the self-refreshing type with an improved function of monitoring self refresh.

The integrated circuit according to the invention is of the type having a semiconductor chip, first and second functional circuits formed on the chip, the first functional circuit generating an internal signal in response to at least one input signal, the second functional circuit receiving the internal signal and generating an output to be driven outside the chip, and is featured in that a detection circuit for detecting the internal signal is provided on the chip. The detection circuit includes a transistor adapted to receive the internal signal at a control electrode, and a voltage switching element which assumes a conductive stage when a voltage of a predetermined value or more is impressed thereacross. The transistor and the voltage switching elements are connected in series between two of the external terminals.

By applying a voltage of the predetermined value or more between the above two terminals, one voltage switching element is rendered conductive, so that a current corresponding to the internal signal flows through the series connection of the transistor and the voltage switching element. Thus, the state of the internal signal can be detected by observing the current flowing through the series connection.

DETAILED DESCRIPTION OF THE INVENTION

Figure 1:
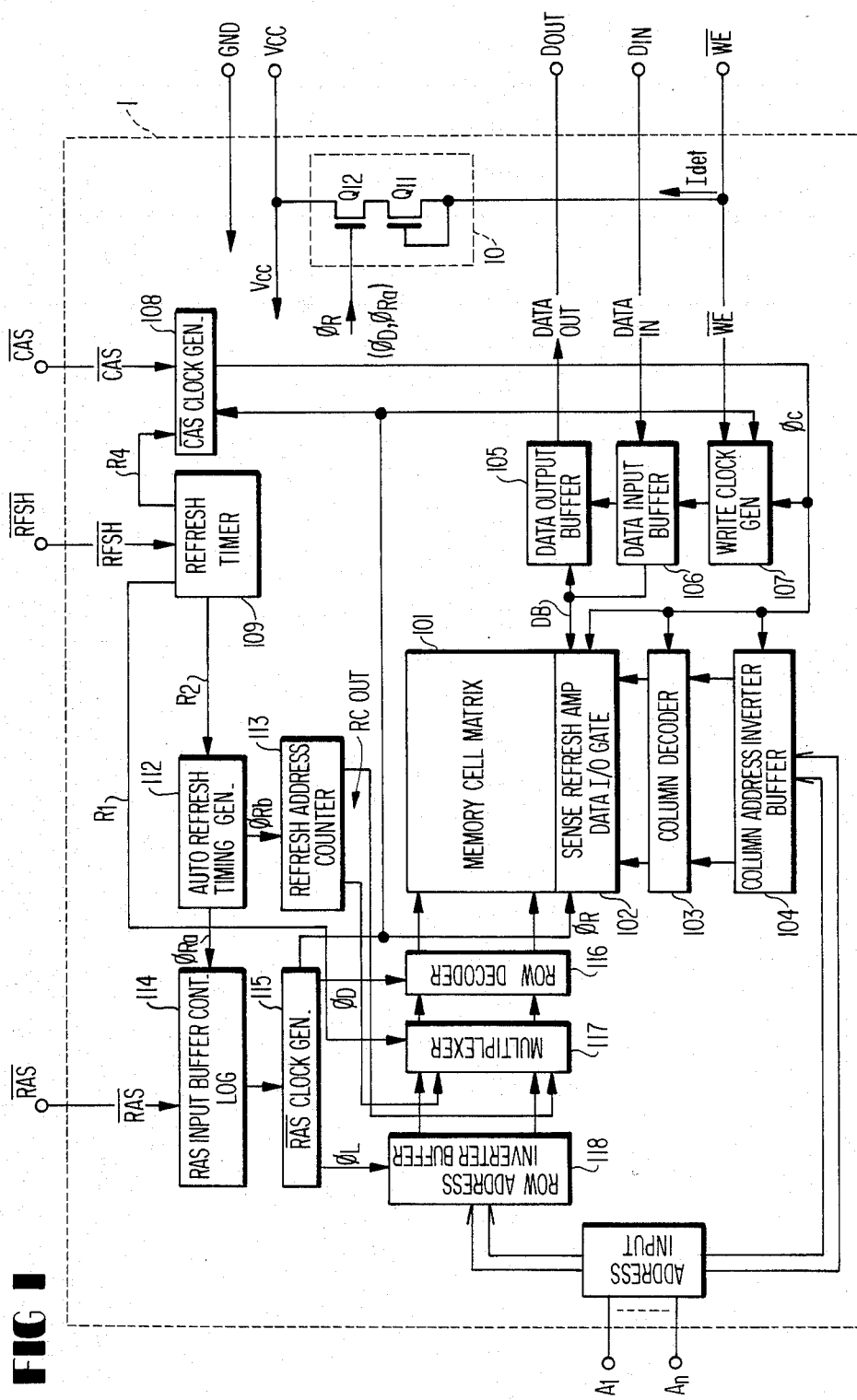
FIG. 1 is a schematic block diagram showing a first embodiment of the invention.

Referring to FIG. 1, a dynamic memory to which the present invention is applied is described.

The memory device formed on a semiconductor chip 1 includes a memory cell matrix 101 of dynamic type memory cells arranged in rows and columns, a circuit block 102 of sense amplifiers and data I/O gates. The memory is a known multi-addressing type in which row address signals and column address signals are taken in via a set of address input terminals Ai to An in response to active levels of a row address strobe $\overline{RAS}$ and a column address strobe $\overline{CAS}$, respectively. A $\overline{RAS}$ input buffer control logic circuit 114 receives $\overline{RAS}$ and drives a $\overline{RAS}$ clock generator 115 which generates a timing signal $\phi_C$ for enabling a row address inverter buffer 118, a timing signal $\phi_D$ for enabling a row decoder 116 to select one of the rows of the matrix 101 and a timing signal $\phi_R$ for enabling sense amplifiers to refresh contents of the memory cells on the selected row. A $\overline{CAS}$ clock generator 108 receives $\overline{CAS}$ and the timing signal $\phi_R$ and generates a timing signal $\phi_C$ for enabling a column address inverter buffer 104, a column decoder 103, data I/O gates, a write clock generator 107, a data input buffer 106 and a data output buffer 105, in a known predetermined sequence. Although the signal $\phi_C$ is representatively illustrated as a single timing signal, a plurality of sequential signals are employed for the above blocks 104, 103, 107, 106 and 105 in practical case.

In order to conduct internal refresh operations which are performed without receiving any address signals, $\overline{RAS}$ and $\overline{CAS}$, the memory is provided with a refresh control timer 109, an auto refreshing timing generator 112, a refresh address counter 113 and a multiplexer 117. The refresh timer 109 receives a refresh control signal $\overline{RFSH}$, and generates control signals $R_1$ to $R_3$ when $\overline{RFSH}$ is kept at a low level, thereby to introduce an internal refresh mode to the memory. In this instance, the control signal $R_1$ controls the multiplexer 117 so that the multiplexer connects parallel outputs RC of the address counter 113 to the row decoder 116 in place of the output of the row address inverter buffer 118. The control signal $R_2$ enables the auto refresh timing generator 112 so that the generator 112 produces a refresh timing signal $\phi_{Ra}$ at the beginning of each refresh cycle which is applied to the $\overline{RAS}$ input buffer control logic circuit 114 and a refresh address incrementing signal $\phi_{Rb}$ which is applied to the refresh address counter 113 thereby to increment the content of the counter 113. In response to the signal $\phi_{Ra}$, the circuit 114 controls the $\overline{RAS}$ clock generator 115 so that the generator 115 generates the timing signals $\phi_C$, $\phi_D$ and $\phi_R$. Thus, the row decoder 116 selects one of the rows of the matrix 101 based on the content of the refresh address counter 113 and the sense amplifiers 102 are enabled in response to the timing signal $\phi_R$ thereby to refresh the memory cells on the selected row. Thereafter, the address content of the address counter 113 is incremented in response to the signal $\phi_{Rb}$. The above sequence of operations is repeated as long as the $\overline{RFSH}$ H is kept at a low level. The further detailed feature of this memory is disclosed in U.S. Pat. No. 4,334,295 issued to Nagami.

In this memory, it is important to detect the cycle time of internal refresh operation in order to evaluate data holding function of the memory.

In this point of view, a refresh detecting circuit 10 is provided on the semiconductor chip 1 according to the present invention. The refresh detection circuit 10 includes a field effect transistor Q12 having a gate receiving the signal $\phi_R$ and a source coupled to a power voltage terminal Vcc and a field effect transistor Q11 having a gat and a drain commonly connected to a write control terminal $\overline{WE}$ which assumes a high level during a read cycle and a refresh cycle and a low level during a write cycle, and a source connected to a drain of the transistor Q12.

Figure 2:
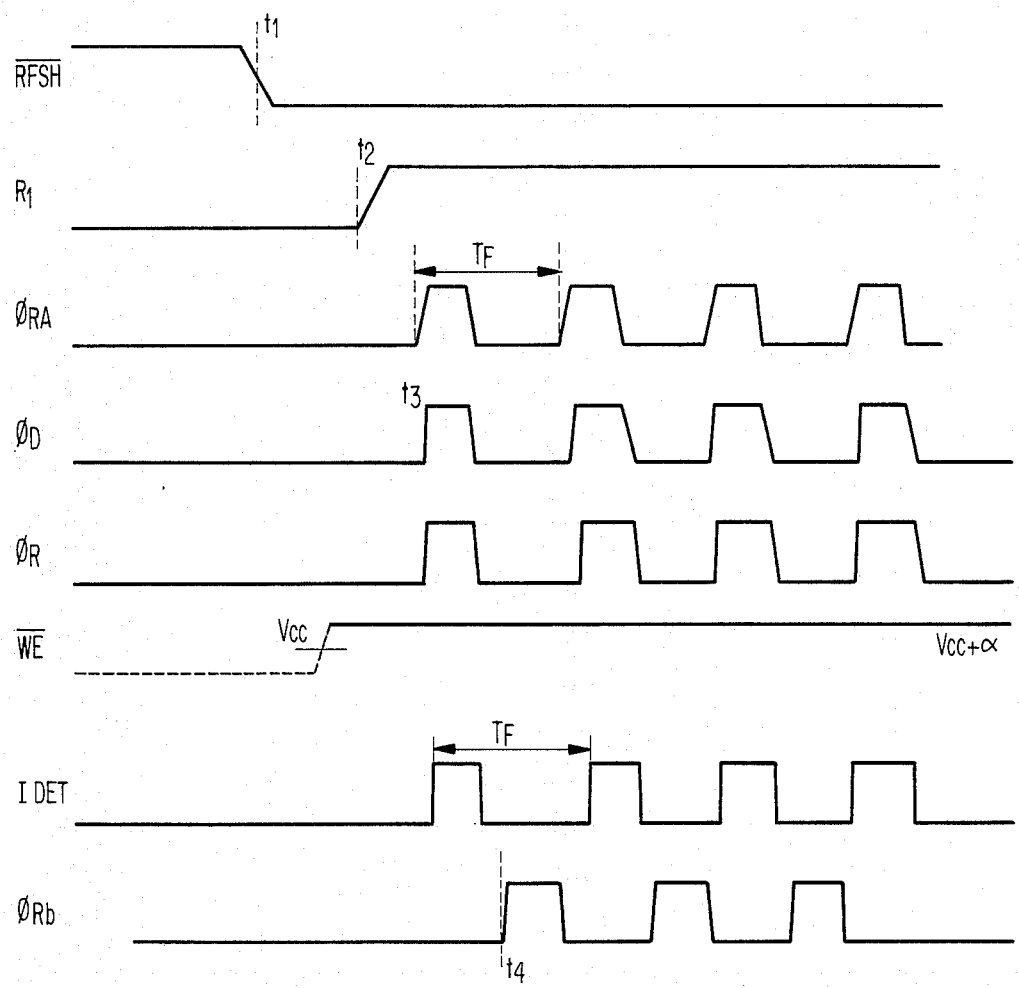
FIG. 2 is a diagram showing the operation of the embodiment of FIG. 1.

Referring to FIG. 2, the internal refresh operations of the memory of FIG. 1 are explained.

$\overline{RFS}$ H is turned to a low (GND) level from a high level at a time point $t_1$, and the refresh timer 109 generates the signals $R_1$ and $R_2$ at a time point $t_2$ so that an internal refresh mode is introduced in the memory. In response to this, the timing generator 112 generates the signal $\phi_{Ra}$ at a time point $t_3$ so that the $\overline{RAS}$ clock generator 115 generates the signals $\phi_D$ and $\phi_R$ so that the output RC of the refresh address counter 113 drives the row decoder 116 so as to select one row of the matrix and contents of memory cells on the selected row are refreshed by the sense amplifiers. Meanwhile, the terminal $\overline{WE}$ is raised to the voltage (Vcc+$\alpha$) which is larger than the sum of the voltage VCC and a threshold voltage of the transistor Q11, from $t_2$. In this instance, the memory does not operate in a write cycle. A write clock generator 107 recognizes the above potential at the terminal $\overline{WE}$ as an inactive level which does not indicate a write operation, and the above high voltage at $\overline{WE}$ does not cause any conflict between the operation of the generator 107 and the internal refresh operation. Accordingly, the transistor Q11 assumes a conductive state so that a detection current Idet flows from the terminal $\overline{WE}$ to the voltage terminal in response to the activation of the signal $\phi_R$ substantially at $t_3$. After the refresh conducted by the signal $\phi_R$, the timing generator 112 generates the signal $\phi_{Rb}$ to increment the content of the refresh address counter 113 for preparation of a subsequent refresh cycle, at a time point $t_4$. After a refresh cycle period TF has elapsed from $t_3$, the timing generator 112 generates the signal $\phi_{Ra}$ and the clock generator 115 generates the signals $\phi_D$ and $\phi_R$, so that memory cells on the different rows are refreshed. As long as the $\overline{RFSH}$ is maintained at a low level, the above refresh cycle is repeatedly carried out with a refresh cycle TF which is solely determined by the timing generator 112 and cannot be controlled from the outside. As illustrated, the above refresh cycle TF can be observed by the current Idet flowing through the terminal $\overline{WE}$ according to the invention.

In this embodiment, in place of applying the signal $\phi_R$ to the gate of the transistor Q12, the signal $\phi_D$ or $\phi_{Ra}$ may be applied to the gate of the transistor Q12. Also, instead of the terminal $\overline{WE}$, the gate and drain of the transistor Q11 may be connected to another terminal which is not used in the refresh cycle.

Figure 3:
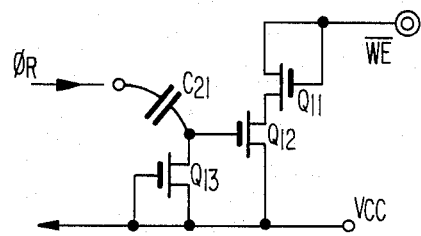
FIG. 3 is a schematic circuit diagram showing a second embodiment of the invention.

FIG. 3 shows another embodiment of the refresh detecting circuit 10. In this embodiment, a field effect transistor Q13 and a boot capacitor C21 are further provided to the circuit 10 of FIG. 1. Namely, a drain-source path of the transistor Q13 is coupled between the power voltage terminal Vcc and the gate of the transistor Q12 with a gate coupled to Vcc. The internal signal $\phi_R$ is applied to the gate of the transistor Q12 via the capacitor C21. When the internal signal $\phi_R$ is at a low level, the gate of Q22 is at a potential of (Vcc-Vth) in which Vth is at the threshold voltage of the transistor Q12. Therefore, Q12 assumes a non-conductive state. When the internal signal $\phi_R$ is turned to a high level, the gate of Q12 is raised above (Vcc+Vth) by a known boot-strap effect, the transistor Q12 assumes a conductive state. Therefore, when the voltage of (Vcc+$\alpha$) is applied to the terminal $\overline{WE}$, a detection current Idet flows from the terminal $\overline{WE}$.

Figure 4:
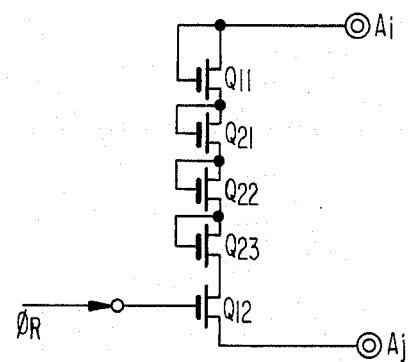
FIG. 4 is a schematic circuit diagram showing a third embodiment of the invention.

FIG. 4 shows a third embodiment of the invention. In this embodiment, diode-connected field effect transistors Q21 to Q23 are inserted in series between the source of the transistor Q11 and the drain of the transistor Q12. Furthermore, in place of the terminals $\overline{WE}$ and VCC, two address input terminals Ai and Aj are connected to the transistors Q11 and Q12. In this embodiment, by applying a voltage more than the sum of threshold voltage of the transistors Q11, Q21 to Q23 and Q12 between the terminals Ai and Aj, a detection of the internal signal $\phi_R$ is performed.

As described above, the detection of an internal signal is conducted effectively according to the invention. It should be noted that the present invention is not limited to the above embodiment. For example, the present invention is applicable to integrated circuits other than memories.

I claim:
1. An integrated circuit, comprising:
   a semiconductor chip;
   a matrix of dynamic type memory cells arranged in rows and columns;
   sense amplifiers;
   means for selecting one of said rows;
   first means for operatively generating a first timing signal for enabling said selecting means;
   second means for operatively generating a second timing signal for enabling said sense amplifiers;
   control means responsive to a control signal for enabling said first and second means, said first and second means being provided with a voltage within a predetermined voltage range;

an internal refresh control circuit responsive to a refresh control signal for generating an internal refresh control signal;
a refresh timing control circuit responsive to said internal refresh control signal for rendering said first and second means operative irrespective of said control signal so that contents of the memory cells are refreshed; and
an internal signal detection circuit, including;
a field effect transistor;
means for applying said internal refresh control signal to the gate of said field effect transistor;
voltage switching which assumes a conductive state when a predetermined voltage, outside said predetermined voltage range, is impressed thereto; and
means for connecting said field effect transistor and said voltage switching means in series between first and second external terminals, wherein generation of said refresh control signal is detected by a current flowing between said first and second external terminals when said predetermined voltage is applied between said first and second external terminals.

2. The integrated circuit according to claim 1, in which said voltage switching means includes at least one diode-connected field effect transistor.

3. The integrated circuit according to claim 1, in which said first external terminals is a power voltage terminal.

4. The integrated circuit according to claim 1, in which said applying means includes a capacitor having one end receiving said one signal and the other end coupled to the gate of said field effect transistor.

5. A semiconductor integrated circuit comprising:
a semiconductor chip;
first to fourth external terminals formed on said semiconductor chip, said first and second external terminals receiving respective power supply voltages within a predetermined range;
first and second circuit means, coupled to each of said first and second external terminals, said first circuit means receiving an input signal through said third external terminal and operatively generating an internal signal, said second circuit means being responsive to said internal signal for operatively performing a predetermined operation; and
a detection circuit for detecting the generation of said internal signal, said detection circuit including:
a first transistor having a control electrode;
means for applying said internal signal to the control electrode of said first transistor to make said first transistor conductive;
voltage switching means assuming a conductive state when a predetermined voltage outside said predetermined range is applied thereto; and
means for connecting said first transistor and said voltage switching means between said first external terminal and said fourth external terminal;
wherein the generation of said external signal is detected by a current flowing via said fourth external terminal when said predetermined voltage is applied to said fourth terminal.

6. The integrated circuit according to claim 5, in which said voltage switching means includes at least one diode-connected transistor.

7. The integrated circuit according to claim 5, in which said internal signal applying means includes a capacitor having a first end receiving said internal signal and a second end coupled to the control electrode of said first transistor.

8. The integrated circuit according to claim 5, in which said circuit means includes a memory circuit and said first circuit means includes a refresh control circuit for performing a refresh operation on said memory.

9. A semiconductor integrated circuit comprising:
a semiconductor chip;
first and second external terminals formed on said semiconductor chip and receiving a power supply within a predetermined voltage range;
third and fourth external terminals formed on said semiconductor chip;
first, second and third circuit means formed on said semiconductor chip, said first circuit means receiving an input signal through said third external terminal and operatively generating an internal signal, said second circuit means being responsive to said internal signal for operatively performing a first predetermined operation, said third circuit means being coupled to said fourth external terminal and operatively performing a second predetermined operation during a period other than the period when said second circuit means performs said first predetermined operation and disregarding the state of said fourth external terminal during the period when said second circuit means performs said first predetermined operation; and
a detection circuit for detecting the generation of said internal signal, said detection circuit including:
a first transistor;
control means responsive to said internal signal for rendering said first transistor conductive;
voltage switching means assuming a conductive stage when a predetermined voltage outside said predetermined voltage range is applied thereto; and
connecting means for connecting said first transistor and said voltage switching means in series between said first and fourth external terminals;
wherein the generation of said internal signal is detected by a current flowing between said first and fourth external terminals when said predetermined voltage is applied to said fourth external terminal.

10. A semiconductor integrated circuit comprising:
a semiconductor chip;
first and second external terminals formed on said semiconductor chip and receiving a power supply within a predetermined voltage range;
third and fourth external terminals formed on said semiconductor chip, said first circuit means receiving an input signal through said third external terminal and operatively generating an internal signal, said second circuit means being responsive to said internal signal for operatively performing a first predetermined operation, said third circuit means being coupled to said fourth external terminal and operatively performing a second predetermined operation during a period other than the period when said second circuit means performs said first predetermined operation and disregarding the state of said fourth external terminal during the period when said second circuit means performs said first predetermined operation; and
a detection circuit for detecting the generation of said internal signal, said detection circuit including:
first and second field effect transistors connected in series between said first and fourth external terminals, the gate of said second transistor being connected to said fourth external terminal, a capacitor having a first end coupled to the gate of said first transistor and a second end receiving said internal signal; and a third field effect transistor coupled between said first external terminal and the gate of said first transistor and having a gate coupled to said first external terminal;

wherein the generation of said internal signal is detected by a current flowing between said first and fourth external terminals when a voltage outside said predetermined voltage range by at least a threshold voltage of said second transistor is applied to said fourth external terminal.

* * * * *

UNITED STATES PATENT AND TRADEMARK OFFICE
CERTIFICATE OF CORRECTION

PATENT NO. : 4,807,197

DATED : February 21, 1989

INVENTOR(S) : Hiroshi WATANABE

It is certified that error appears in the above-identified patent and that said Letters Patent is hereby corrected as shown below:

COLUMN 2, LINE 41    Delete "RASand" and insert therefor --RAS and--.

COLUMN 3, LINE 22    Delete "$\overline{RFSH}$ H" and insert therefor --$\overline{RFSH}$--.

COLUMN 3, LINE 34    Delete "gat" and insert therefor --gate--.

COLUMN 3, LINE 41    Delete "$\overline{RFS}$ H" and insert therefor --$\overline{RFSH}$--.

COLUMN 3, LINE 53    Delete "VCC" and insert therefor --Vcc--.

UNITED STATES PATENT AND TRADEMARK OFFICE
CERTIFICATE OF CORRECTION

PATENT NO. : 4,807,197

DATED : February 21, 1989

INVENTOR(S) : Hiroshi WATANABE

It is certified that error appears in the above-identified patent and that said Letters Patent is hereby corrected as shown below:

COLUMN 4, LINE 42   Delete "VCC" and insert therefor --$V_{cc}$--.

Signed and Sealed this

Twenty-sixth Day of December, 1989

Attest:

JEFFREY M. SAMUELS

Attesting Officer      Acting Commissioner of Patents and Trademarks